(12) United States Patent
Lee et al.

(10) Patent No.: US 7,655,568 B2
(45) Date of Patent: Feb. 2, 2010

(54) METHOD FOR MANUFACTURING UNDERLYING PATTERN OF SEMICONDUCTOR DEVICE

(75) Inventors: Sung Koo Lee, Seoul (KR); Jae Chang Jung, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 288 days.

(21) Appl. No.: 11/468,084

(22) Filed: Aug. 29, 2006

(65) Prior Publication Data

US 2007/0148983 A1      Jun. 28, 2007

(30) Foreign Application Priority Data

Dec. 28, 2005   (KR) .................. 10-2005-0132110
Jul. 25, 2006   (KR) .................. 10-2006-0069760

(51) Int. Cl.
*H01L 21/311*   (2006.01)

(52) U.S. Cl. .............. 438/695; 438/717; 257/E21.026; 257/E21.232

(58) Field of Classification Search ......... 438/689–695, 438/717, 726; 257/E21.026, E21.232
See application file for complete search history.

(56) References Cited

U.S. PATENT DOCUMENTS 5,186,788 A *   2/1993   Hashimoto et al. .......... 430/313
5,667,940 A     9/1997   Hsue et al. .................. 430/312
6,140,023 A *   10/2000  Levinson et al. ............ 430/313
6,534,414 B1    3/2003   Wang et al. ................. 438/709
6,586,339 B1    7/2003   Plat et al. ................... 438/706
6,916,749 B2    7/2005   Tsujita et al. ............... 438/758
6,969,580 B2 *  11/2005  Minami ..................... 430/313
6,994,945 B2 *  2/2006   Takeda et al. ............. 430/270.1

FOREIGN PATENT DOCUMENTS

| JP | 04-176123 | 6/1992 |
| KR | 10-1998-028362 | 7/1998 |
| KR | 10-1999-0061090 | 7/1999 |
| KR | 10 2005 011910 A | 12/2005 |

OTHER PUBLICATIONS

Official action in counterpart application KR 10 2006 0069760, issued Oct. 23, 2007 (including English translation thereof).
Translation of Office Action for corresponding Taiwanese Application No. 095131538, dated Jun. 8, 2009.

* cited by examiner

*Primary Examiner*—Khiem D Nguyen
(74) *Attorney, Agent, or Firm*—Marshall, Gerstein & Borun LLP

(57) ABSTRACT

Disclosed herein is a method for manufacturing a semiconductor device that includes performing an $O_2$ plasma treatment step after forming a Si-containing photoresist film.

8 Claims, 8 Drawing Sheets

METHOD FOR MANUFACTURING UNDERLYING PATTERN OF SEMICONDUCTOR DEVICE

BACKGROUND OF THE INVENTION

The disclosure generally relates to a method for manufacturing a semiconductor device. More specifically, the disclosure relates to a method for pattern formation which can overcome the resolution limit of a lithography process in fabricating a semiconductor device.

BRIEF DESCRIPTION OF RELATED TECHNOLOGY

Recently, a double exposure process has been performed to form a fine pattern of semiconductor devices to overcome the resolution limit of exposer equipment. The conventional process is as follows.

Referring to FIGS. 1a and 1b, an underlying layer 12, a first hard mask layer 13, a first anti-reflection film 14 and a first photoresist film 15 are sequentially formed over a semiconductor substrate 11. A first region among the entire surface is exposed using a first exposure mask 16, and the exposed photoresist film 15 is developed to form a first photoresist pattern 15'. The hard mask layer 13 generally is a bi-layer of amorphous carbon layer and inorganic hard mask layer.

Referring to FIGS. 1c and 1d, the first anti-reflection film 14 is etched with the first photoresist pattern 15' as a mask, thereby forming a first anti-reflection pattern 14'. After etching the first hard mask layer 13 with the first anti-reflection pattern 14' as a mask, a first hard mask pattern 13' is formed.

Referring to FIGS. 1e and 1f, a second hard mask layer 17, a second anti-reflection film 18 and a second photoresist film 19 are sequentially formed over the first hard mask pattern 13'. A second region among the entire surface is exposed alternately with the first region using a second exposure mask 20, and the exposed photoresist film 19 is developed to form a second photoresist pattern 19'. The second hard mask layer 17 preferably has different etching selectivity with the first hard mask layer 13.

Referring to FIGS. 1g and 1h, the second anti-reflection film 18 is etched with the second photoresist pattern 19' as a mask, thereby forming a second anti-reflection pattern 18'. After etching the second hard mask layer 17 with the second anti-reflection pattern 18' as a mask, a second hard mask pattern 17' is formed.

Referring to FIG. 1i, an underlying layer 12 is etched with the first and second hard mask patterns 13', 17' as a mask, thereby obtaining a fine pattern 12'.

In the above-described conventional method, however, a photoresist film, an anti-reflection film and a hard mask layer must be coated and etched twice respectively, in order to form a fine pattern. Therefore, the overall process becomes complicated, resulting in the reduction of the total yield.

SUMMARY OF THE DISCLOSURE

Disclosed herein is a method for manufacturing a semiconductor device that includes performing an $O_2$ plasma treatment step over a silicon (Si)-containing photoresist film. The disclosed method is advantageous in that the coating and etching steps except for photoresist film need only be performed once, simplifying and reducing the overall time and costs of conventional processes.

BRIEF DESCRIPTION OF THE DRAWINGS

To understand the present invention more completely, reference should be made to the following detailed description and accompanying drawings wherein.

Figure 1A:
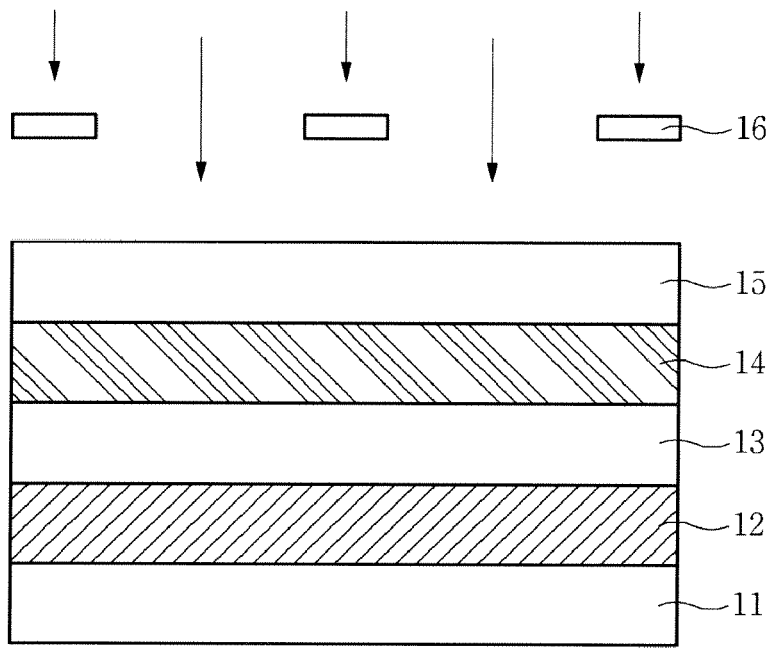
FIGS. 1a through 1i are cross-sectional diagrams illustrating a conventional method for forming a semiconductor device.
Figure 1B:
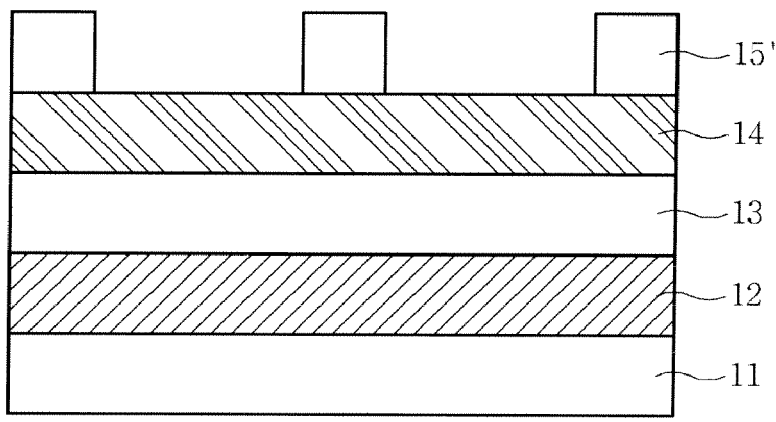
Figure 1C:
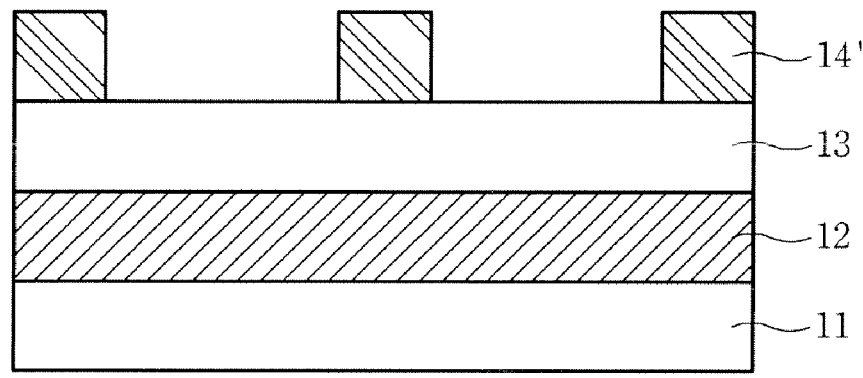
Figure 1D:
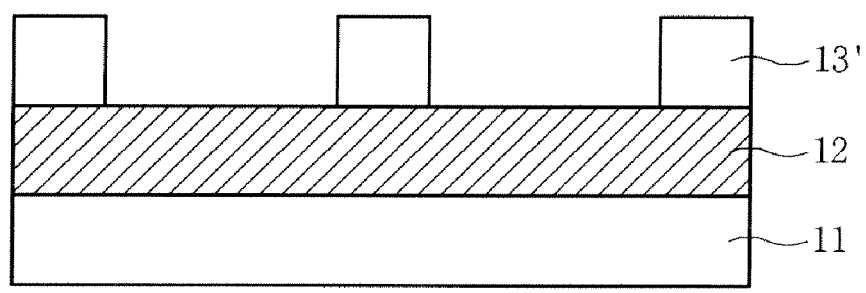
Figure 1E:
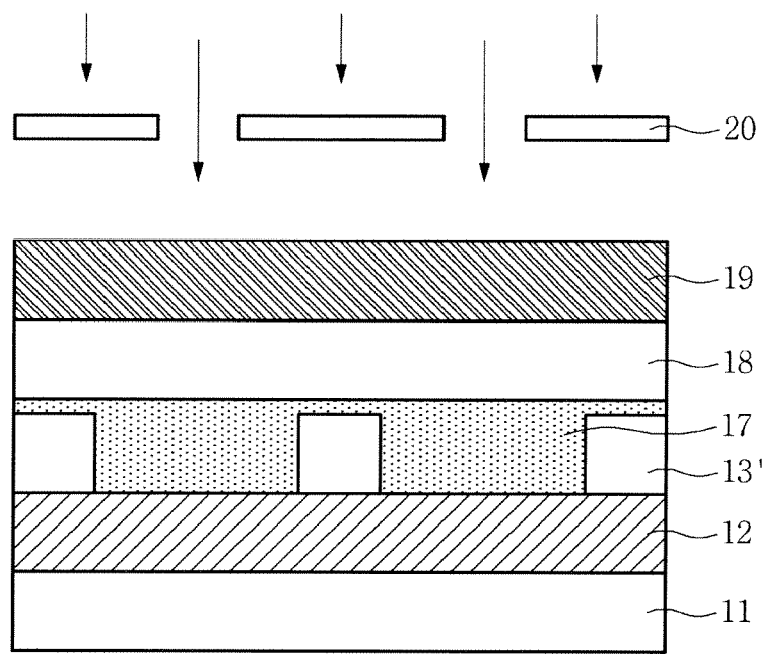
Figure 1F:
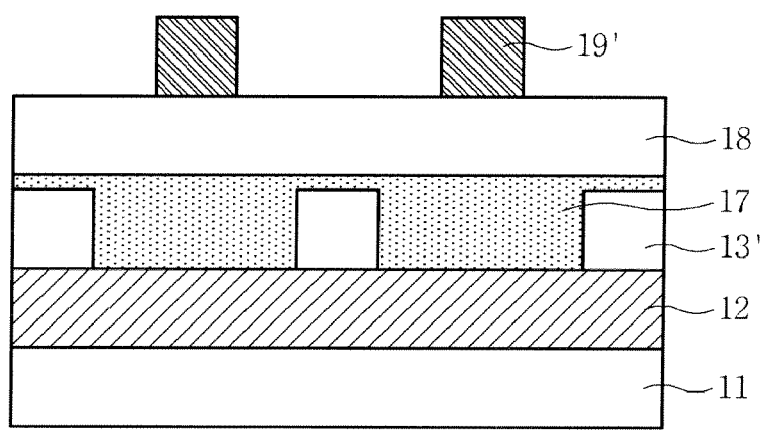
Figure 1G:
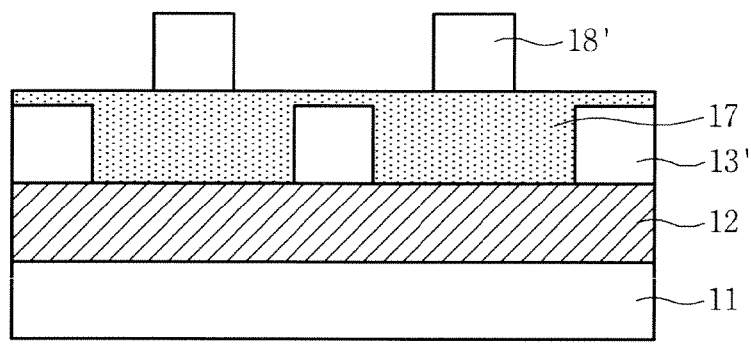
Figure 1H:
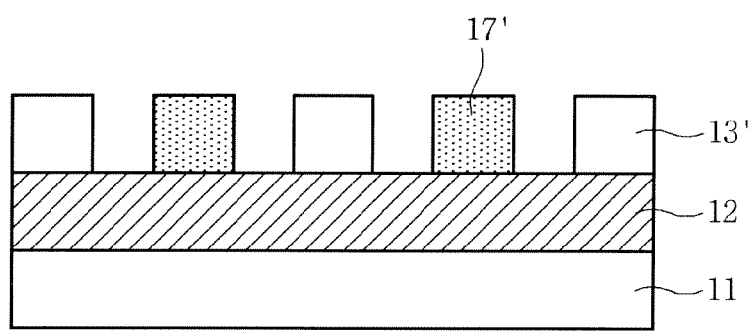
Figure 1I:
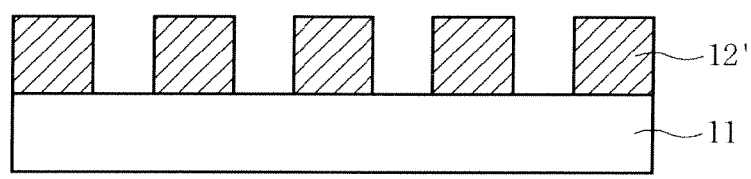

While the disclosed method is susceptible of embodiments in various forms, there are illustrated in the drawing (and will hereafter be described) specific embodiments of the invention, with the understanding that the disclosure is intended to be illustrative, and is not intended to limit the invention to the specific embodiments described and illustrated herein.

DETAILED DESCRIPTION OF THE PRESENTLY PREFERRED EMBODIMENTS

Disclosed herein is a method for manufacturing a semiconductor device that includes sequentially forming an underlying layer, a hard mask layer, an anti-reflection film, and a Si-containing first photoresist film over a semiconductor substrate. The method also includes forming a first photoresist pattern by exposing and developing the first photoresist film using a first exposure mask, and performing $O_2$ plasma treatment over the first photoresist pattern. The method further includes forming a second photoresist film over the $O_2$ plasma-treated first photoresist pattern, and forming a second photoresist pattern by exposing and developing alternate region with the first photoresist pattern using a second exposure mask. The method also includes etching the anti-reflection film with the first and second photoresist patterns as a mask, thereby forming a anti-reflection pattern, and forming a hard mask pattern by etching the hard mask layer with the anti-reflection pattern as a mask, and etching an underlying layer with the hard mask pattern as a mask, thereby forming an underlying pattern.

According to the disclosed method, the first photoresist pattern is formed using a photoresist film containing a silicon element. Then, $O_2$ plasma treatment is performed to oxidize the silicon in the first photoresist pattern so that the first photoresist pattern may not be developed in a subsequent developing step after the second photoresist film is formed. The silicon is present in an amount ranging from about 10 wt % to about 40 wt %, preferably from about 20 wt % to about 30 wt %, based on the total weight of the first photoresist film.

In the disclosed method, the second photoresist film can be formed using the same or different material of the first photoresist film. The different material means any photoresist composition which does not contain silicon element unlike the first photoresist film. The second photoresist film may be formed using a conventional photoresist composition without restriction.

Meanwhile, for the photoresist composition containing a silicon element, any of conventional organic photoresist compositions comprising a photoresist polymer enabling cross-linking, a photoacid generator and an organic solvent can be used without restriction. The Si-containing photoresist composition can further comprise a cross-linking agent in order to activate the cross-linking reaction upon thermal treatment.

Hereinafter, the disclosed method for manufacturing a semiconductor device is described in detail with reference to FIGS. 2a through 2h, which are cross-sectional diagrams illustrating a method for forming a semiconductor device.

Figure 2A:
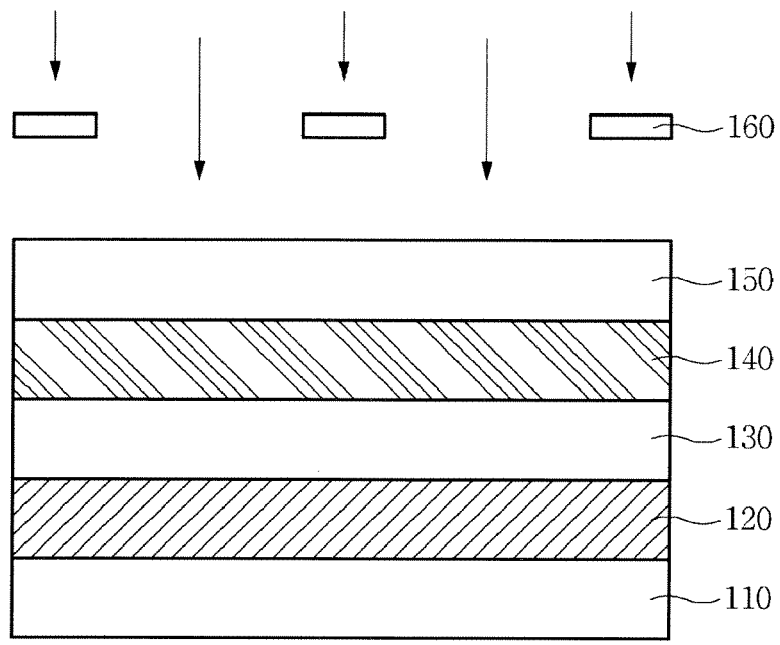
FIGS. 2a through 2h are cross-sectional diagrams illustrating a method of the present invention for forming a semiconductor device.
Figure 2B:
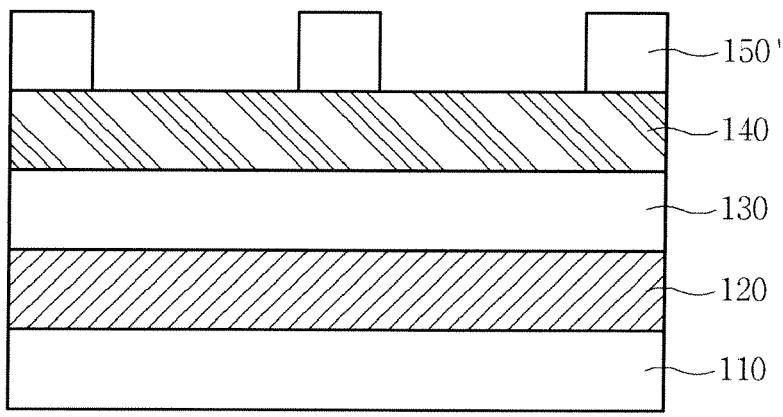

Referring to FIGS. 2a and 2b, an underlying layer 120, a hard mask layer 130, a first anti-reflection film 140, and a first photoresist film 150 are sequentially formed over a semiconductor substrate 110. A first region among the entire surface is exposed using a first exposure mask 160, and exposed photoresist film 150 is developed to form a first photoresist pattern 150'. The first photoresist film 150 contains silicon (Si) preferably in an amount ranging from about 10 wt % to about 40 wt %, based on the total weight of the first photoresist film. The hard mask layer 130 is generally composed of a bi-layer of amorphous carbon layer and inorganic hard mask layer. In addition, the light source in the exposing steps can be any source capable of providing light having wavelength below 400 nm. Specifically, the light source is preferably selected from the group consisting of ArF (193 nm), KrF (248 nm), EUV (extreme ultraviolet), VUV (vacuum ultraviolet), E-beam, X-ray, and ion-beam. Among them, ArF, KrF or VUV is more preferable, and ArF is most preferable. The exposing step generally is performed with an exposure energy ranging from about 70 mJ/cm$^2$ to about 150 mJ/cm$^2$, preferably about 100 mJ/cm$^2$ depending on the types of photoresist film.

Figure 2C:
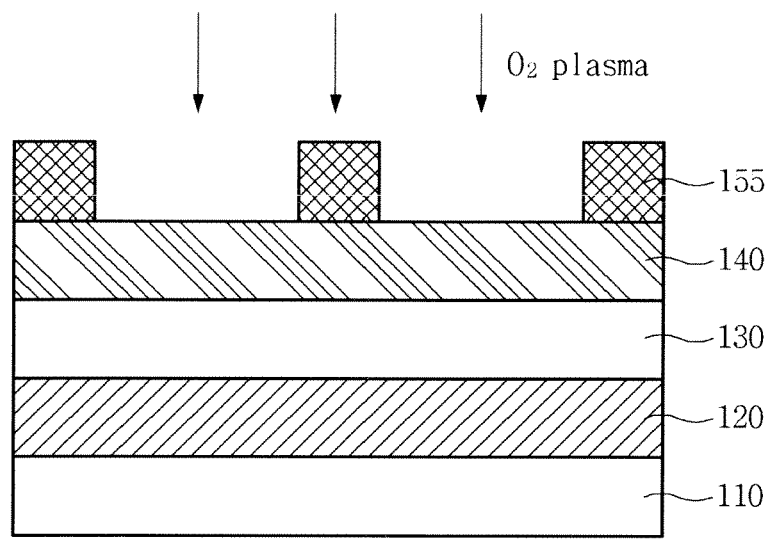

Referring to FIG. 2c, $O_2$ plasma is treated over the first photoresist pattern 150' to oxidize silicon contained therein, thereby forming a $SiO_2$-containing first photoresist pattern 155.

Figure 2D:
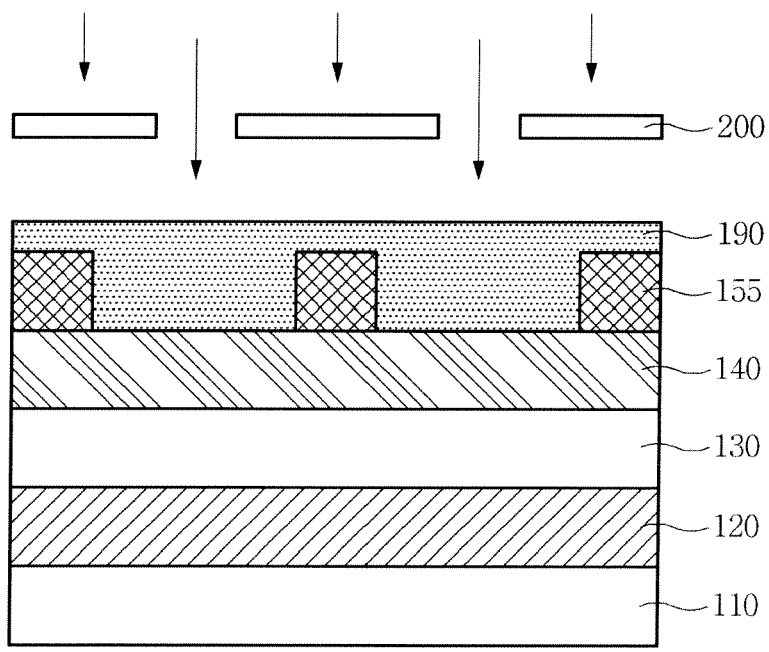
Figure 2E:
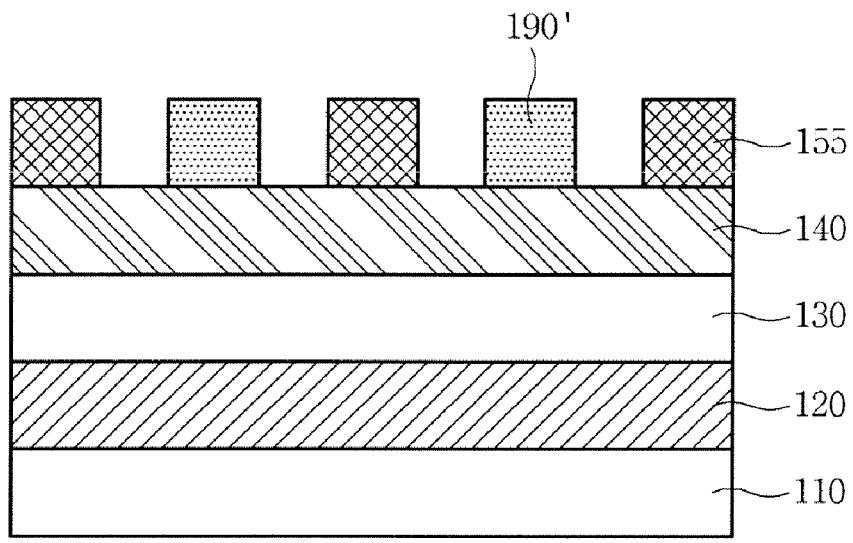

Referring to FIGS. 2d and 2e, a second photoresist film 190 is formed over the $SiO_2$-containing first photoresist pattern 155. A second region among the entire surface is exposed (alternately with the first region) using a second exposure mask 200, and exposed photoresist film 190 is developed to form a second photoresist pattern 190'. The first photoresist pattern 155 is remained despite of developing step due to the oxidation of Si into $SiO_2$ by $O_2$ plasma treatment.

Figure 2F:
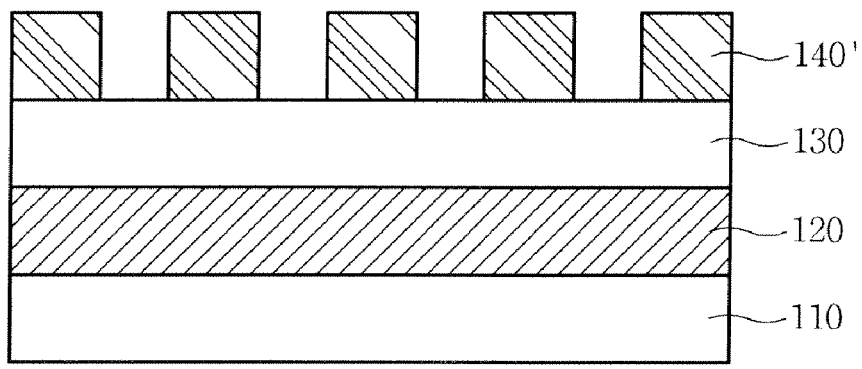
Figure 2G:
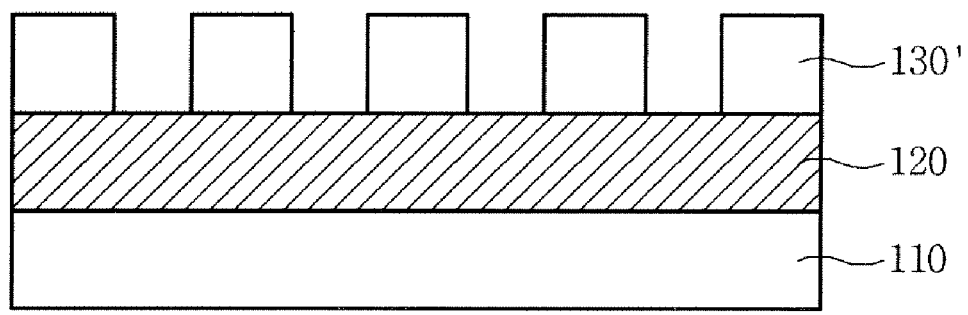

Referring to FIGS. 2f and 2g, the anti-reflection film 140 is etched with the first and second photoresist patterns 155, 190' as a mask, thereby forming an anti-reflection pattern 140'. After etching the hard mask layer 130 with the anti-reflection pattern 140' as a mask, a hard mask pattern 130' is formed.

Figure 2H:
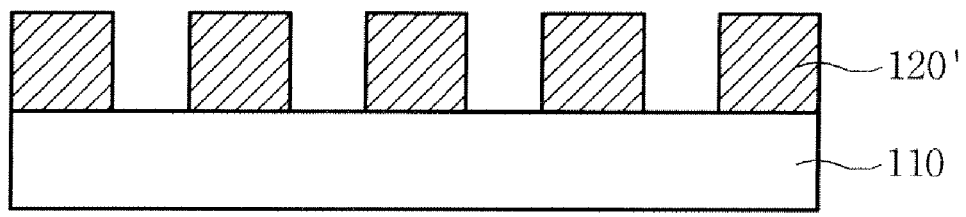

Referring to FIG. 2h, an underlying layer 120 is etched with the hard mask patterns 130' as a mask, and the hard mask patterns are removed, thereby obtaining a fine pattern 120'.

As described above, the disclosed method for manufacturing a semiconductor device includes performing an $O_2$ plasma treatment step after forming a Si-containing photoresist film.

What is claimed is:

1. A method for manufacturing a semiconductor device, the method comprising:
    (a) sequentially forming an underlying layer, a hard mask layer, an anti-reflection film, and an Si-containing first photoresist film over a semiconductor substrate;
    (b) forming a first photoresist pattern by exposing and developing the first photoresist film using a first exposure mask;
    (c) performing $O_2$ plasma treatment over the first photoresist pattern;
    (d) forming a second photoresist film over the $O_2$ plasma-treated first photoresist pattern, and forming a second photoresist pattern by exposing and developing an alternate region, relative to the first photoresist pattern, using a second exposure mask;
    (e) etching the anti-reflection film with the first and second photoresist patterns as a mask, thereby forming an anti-reflection pattern; and
    (f) forming a hard mask pattern by etching the hard mask layer with the anti-reflection pattern as a mask, and etching the underlying layer with the hard mask pattern as a mask, thereby forming an underlying pattern.

2. The method of claim 1, wherein the first photoresist film comprises silicon in an amount ranging from 10 wt % to 40 wt %, based on the total weight of the first photoresist film.

3. The method according to claim 1, wherein a light source for an exposure process is selected from the group consisting of ArF (193 nm), KrF (248 nm), EUV (extreme ultraviolet), VUV (vacuum ultraviolet), E-beam, X-ray, and ion-beam.

4. The method according to claim 3, wherein the light source is ArF (193 nm).

5. The method according to claim 1, wherein the hard mask layer comprises a bi-layer of an amorphous carbon layer and an inorganic hard mask layer.

6. The method according to claim 1, comprising exposing in (b) and (e) with an exposure energy of about 70 mJ/cm$^2$ to about 150 mJ/cm$^2$.

7. The method according to claim 6, wherein the exposure energy is about 100 mJ/cm$^2$.

8. The method according to claim 1, comprising forming the second photoresist film using the same or different material of the first photoresist film.

* * * * *